United States Patent
Wasohura

(10) Patent No.: US 8,023,558 B2
(45) Date of Patent: *Sep. 20, 2011

(54) METHOD AND APPARATUS FOR MEASURING THE INPUT FREQUENCY RESPONSE OF A DIGITAL RECEIVER

(75) Inventor: Thomas E. Wasohura, Menlo Park, CA (US)

(73) Assignee: Tektronix, Inc., Beaverton, OR (US)

( * ) Notice: Subject to any disclaimer, the term of this patent is extended or adjusted under 35 U.S.C. 154(b) by 790 days.

This patent is subject to a terminal disclaimer.

(21) Appl. No.: 11/226,691

(22) Filed: Sep. 14, 2005

(65) Prior Publication Data

US 2006/0067392 A1   Mar. 30, 2006

Related U.S. Application Data

(60) Provisional application No. 60/614,024, filed on Sep. 27, 2004.

(51) Int. Cl.
    *H04B 3/46* (2006.01)
(52) U.S. Cl. ........ 375/224; 375/225; 375/226; 375/231; 375/220; 375/222

(58) Field of Classification Search .................. 375/224, 375/225, 226, 231, 220, 222
See application file for complete search history.

(56) References Cited

U.S. PATENT DOCUMENTS

| 4,637,036 A * | 1/1987 | Kobari ........................ 375/317 |
| 5,521,959 A * | 5/1996 | Walsworth et al. ........ 379/27.04 |

FOREIGN PATENT DOCUMENTS

EP   1143654 A2 * 10/2001

* cited by examiner

*Primary Examiner* — Kabir A Timory
(74) *Attorney, Agent, or Firm* — Douglas A. Chaikin; Michael A. Nelson

(57) ABSTRACT

A frequency response measurement circuit includes a generation circuit operative to provide an input signal having a voltage and programmable frequency characteristics in response to a frequency control signal. A decision circuit is coupled to the generation circuit and is operative to sample the input signal at predetermined intervals in response to a sampling clock signal and determine the amplitude characteristics of the input signal relative to a variable threshold signal. A control circuit is coupled to the decision circuit, and is operative to determine the frequency response characteristics of the input signal at varying frequencies and threshold voltages in response to the frequency control signal.

8 Claims, 4 Drawing Sheets

FIG.—1

METHOD AND APPARATUS FOR MEASURING THE INPUT FREQUENCY RESPONSE OF A DIGITAL RECEIVER

The present application claims the benefit of U.S. Provisional application Ser. No. 60/614,024, filed Sep. 27, 2004.

BACKGROUND OF THE INVENTION

1. Field of the Invention

The present invention generally relates to diagnostic and test equipment for analyzing high-speed data bit streams and, more particularly, to devices and methods capable of measuring, among other things, the analog input performance of a high-speed data communications receiver.

2. Description of the Related Art

Frequency response is a common measure for diagnosing and analyzing a communication channel. Among other things, the frequency response of a communication channel defines the analog bandwidth that limits the channel capacity. Understanding the frequency response is a key element to diagnosing problems with individual devices and entire systems.

There exists presently commercial instruments known as network analyzers or vector network analyzers. These analyzers measure frequency response directly from the channel under test. These devices typically output sine waves at various frequencies and measure the sine wave power output from a device under test (DUT). The analyzer then is able to display the ratio of input power to output power versus frequency for the DUT.

It is known to build similar functionality from separate devices or instruments such as a synthesizer (sine wave generator) and an RF power meter for a more manual test. Power meters can be replaced with spectrum analyzers in this application, as well. The power meter then is capable of measuring the output power of the device. In all cases, the test system generates a sine wave of known amplitude and presents this to the DUT. Then the DUT outputs a sine wave back to the test system and the test system calculates and presents the ratio of output power to input power.

However, none of the aforementioned systems or analyzers truly tests the input frequency response of a decision circuit. For example, the goal of a decision circuit is to digitally sample the input signal and output a logical one or zero as a result of the decision. This is compatible with measuring the output of a sine wave for a power measurement to be measured by a power meter. Also decision circuit outputs are often highly integrated with other functions including serial to parallel shift registers that aggregate the binary decisions into multi-bit parallel words that, again, cannot be presented to a power meter for a power measurement.

There presently exists an urgent need to be able to measure the analog frequency response of the DUT, so that a proper measurement of that point of a digital receiver can be made. Thus, there still exists the need to be able to measure such digital receivers in transceiver devices and receiver-only devices.

SUMMARY OF THE INVENTION

A frequency response measurement circuit includes a generation circuit operative to provide an input signal having a voltage and programmable frequency characteristics in response to a frequency control signal. A decision circuit is coupled to the generation circuit and is operative to sample the input signal at predetermined intervals in response to a sampling clock signal and determine the amplitude characteristics of the input signal relative to a variable threshold signal. A control circuit is coupled to the decision circuit, and is operative to determine the frequency response characteristics of the input signal at varying frequencies and threshold voltages in response to the frequency control signal.

A frequency response measurement method includes receiving an input signal to sample. Next, sample the voltage characteristics of the input signal relative to a threshold voltage value at a corresponding frequency. This may be accomplished, for example, by comparing the input signal voltage to a threshold voltage value. Next, adjust the threshold voltage value at the corresponding frequency. Then sample the voltage characteristics of the input signal relative to the adjusted threshold voltage value at the corresponding frequency. This may be accomplished; for example, by comparing the input signal voltage to the adjusted threshold voltage value. After performing the adjusted voltage comparison, repeat the previous sampling and adjusting operations until the input voltage and threshold voltages intersect. Then, plot the intercept values relative to the corresponding frequency.

It is a general object of the present invention to provide a method and apparatus for measuring an analog input frequency response at the decision point of a digital receiver.

It is an additional object of the present invention to provide a method and apparatus for measuring an analog input frequency response at the decision point of a digital receiver which is capable of being integrated with present digital receivers.

It is an additional object of the present invention to provide a method and apparatus for measuring the an analog input frequency response at the decision point of a digital receiver wherein such apparatus and the method of using the same is a stand alone test device requiring little if any modifications of presently existing digital receivers.

An advantage provided by the present invention is the ability to measure an analog input frequency response at the decision point of a digital receiver.

Another advantage provided by the present invention is to provide a method and apparatus for measuring the analog input frequency response at the decision point of a digital receiver using a separate measuring instrument that requires only minor modifications of the digital receiver.

In an exemplary embodiment, there are various mechanisms for measuring the maximum and minimum amplitude of an input sine wave. In the exemplary embodiment, the maximum and minimum amplitudes are determined by moving the decision threshold voltage of the decision circuit and then measuring the change in the resulting decisions. It will be appreciated, that as a result of performing the method of the present invention that the measurement may be done synchronously or asynchronously to the sampling rate of the decision circuit.

The asynchronous mode of the exemplary embodiment employs sampling of the applied known-amplitude sine wave. In this case, when the decision point is "inside" the sine wave's amplitude, the output decisions are nominally 50% true and 50% false. However, as the voltage threshold is moved above the applied sine wave input, all applied signal voltages are below the threshold so all logic falses are output. Similarly, when the voltage threshold is moved below the applied sine wave input, all applied signal voltages are above the threshold so all logic trues are output. By moving the threshold voltage to a very high voltage and then stepping it down to the point where all logic falses are no longer received, the maximum amplitude can be measured. Similarly, by moving the threshold voltage to a very low voltage and then stepping it up to the point where all logic trues are no longer received, the minimum applied sine wave amplitude can be measured.

Embodiments that use asynchronous sampling can easily measure both low and high frequency responses outside the range of the frequencies of decision making supported by the DUT. Embodiments that use synchronous sampling (such that the applied sine wave frequency is synchronous—in some octave—to the sampling rate of the decision circuit) restricts the flexibility of the applied sine wave stimulus and complicates the setup. Furthermore, synchronous setups must also step the sampling time throughout the applied sine wave input frequency to further find where the maximums and minimums of the input sine wave occur. In cases where the decision circuit only operates on a very narrow-band input frequency (i.e. at one frequency), an asynchronous sampling style would generate the most wideband result.

BRIEF DESCRIPTION OF THE DRAWINGS

For a further understanding of the objects and advantages of the present invention, reference should be had to the following detailed description of the invention, taken in conjunction with the accompanying drawing, in which like parts are given like reference numerals and wherein.

DETAILED DESCRIPTION OF THE INVENTION

An exemplary embodiment of the present invention will now be described in greater detail with reference to FIGS. 1-4. The present invention may, however, be embodied in many different forms and should not be construed as limited to the exemplary embodiments set forth herein; rather these embodiments are provided so that this disclosure will be thorough and complete and will fully convey the invention to those skilled in the art.

It will be understood by those of ordinary skill in the art that the frequency response of a system is a graph of the ratio of the output of the system compared to the input of the system versus frequency of input. Such a graph cannot be created using conventional systems because the output of a decision point of a digital receiver is not accessible as an analog output ready to make a power measurement on. Rather, the decision circuit itself must be used to make the measurement right at the decision point. This is done by stimulating the input of a decision circuit with a sine wave of a particular frequency and then controlling the decision threshold voltage up and down to find what threshold voltages corresponds to the maximum and minimum of the input stimulus. This result represents the amplitude of the received signal at the input to the decision circuit and can then be plotted against the known applied sine wave amplitude (which can be known because it is calibrated) for all frequencies of interest.

There are several mechanisms that allow a decision circuit to measure the maximum and minimum of the input sine wave. These include moving the decision threshold voltage of the decision circuit and measuring the change in resulting decisions. This can be done synchronously or asynchronously to the sampling rate of the decision circuit.

Figure 1:
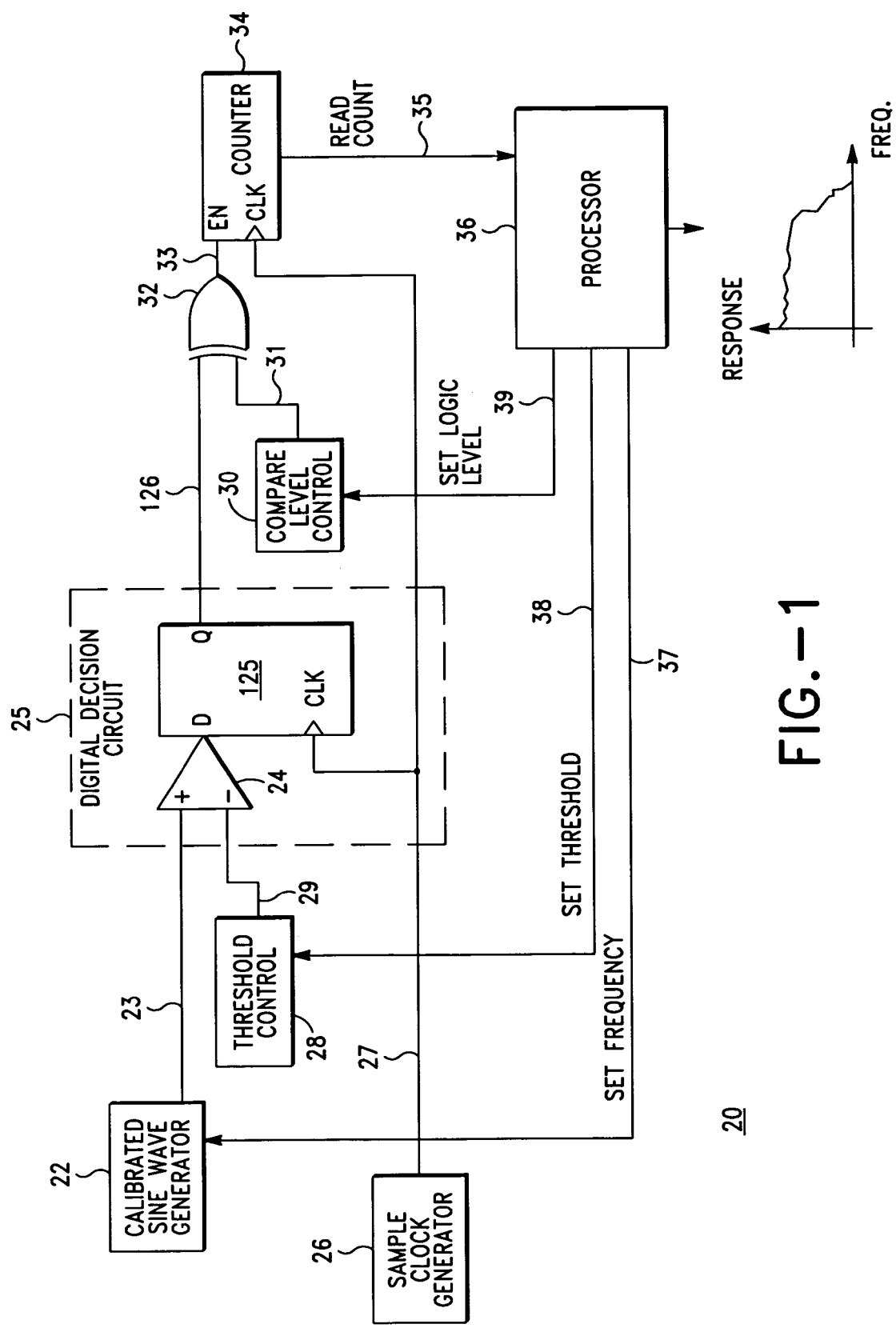
FIG. 1 is a schematic block diagram of an exemplary frequency response circuit configured to operate in an asynchronous mode.

FIG. 1 is a schematic block diagram of an exemplary frequency response circuit 20 configured to operate in an asynchronous mode. The frequency response measurement circuit 20 includes a programmable frequency sine wave generator 22 that provides an input signal 23, for example, a sine wave, to a first input of a decision circuit 25, also referred to as a device under test (DUT) 25. The input signal 23 has an amplitude $V_{in}$. In order to perform the calculations in accordance the invention $V_{in}$ must be known value. $V_{in}$ can be pre-measured during a calibration or initialization phase of the frequency response measurement circuit 20, or a larger circuit or system to which the frequency measurement circuit 20 forms a part.

The decision circuit 25 includes a comparator 24, having a first input and a second input, and a latch or memory component 125, for example, a D-type flip flop. The input signal 23 is coupled to the first (e.g. positive) input of the comparator 24. the second (e.g. negative) input of the comparator 24 is coupled to a threshold control signal 29, provided by a threshold control circuit 28.

A sampling clock generator 26, for example, for example, a commercially available synthesizer or any other suitable frequency oscillator, provides sampling clock signal 27, which is coupled to the trigger or clock (CLK) input of the memory component 125 and counter 34. The sampling clock signal 27 triggers the memory component 125 of the decision circuit 25, thereby, causing the memory component 125 to sample the input signal 23 and transmit the logic result (e.g. logic one or logic zero) to the first input of logic (e.g. exclusive-OR) gate 32. the logic result is the output provided by the comparator 24, which is the value of the comparison of the input signal amplitude value, $V_{in}$, against the applied threshold voltage signal 29 value. In an exemplary embodiment, if the input signal 23 amplitude is greater than the threshold signal 29 value, a logic one is provided on the output of the decision circuit 126; otherwise, a logic zero is provided on the output of the decision circuit 126.

The sampling clock signal 27 frequency can be set to any frequency sufficiently different from the input signal 23, a sine wave or any octave of that sine wave frequency (input sine wave 23). In an exemplary embodiment, the sampling clock signal 27 frequency is set to 9/100 of the data frequency. This restriction assures that there will be an even distribution of samples at various phases of the input sine wave 23 which meets the requirement that the clocking be asynchronous If the sampling clock signals are too close to each other, the sampling may dwell at only one phase of the input signal 23 and generate an erroneous result. If frequency response measurements are desired near the frequency being applied to the input sampling clock, then the frequency of the sampling clock signal 27 can be moved to assure sufficient asynchronous behavior. The amount of frequency deviation between the input sine wave 23 and the sampling clock (or any octave) signal 27 depends on how long each measurement is taken. For very short measurements, a farther more un-related frequency is needed. For longer measurements, clock frequencies that are closer can be used.

A threshold control circuit 28, for example, a digital to analog converter and operational amplifier/buffer used to convert digital values to desired analog threshold levels provides a threshold control signal 29 to a second input of comparator 24. The magnitude (e.g. voltage) of the signal provided by the threshold control circuit 28 is controlled by a set threshold signal 38. The threshold control voltage signal 29 can be varied depending upon the measurement that is sought.

In application, the threshold voltage 29 applied to the decision circuit 25 is set to a level greater than any part of the applied voltage level of the input signal 23. At this point, the output 126 of the decision circuit 125 should be all zeros indicating that at all sample times defined by the sampling clock signal 27, of the input sine wave 23 is below the applied threshold 29. Next, the threshold signal voltage 29 is decreased in small increments until the output of the decision circuit 126 is no longer all zeros. This voltage is defines $V_{hi}$.

A processor or control circuit 36, for example, a microprocessor, mirco-controller, dedicated hardware (e.g. ASIC) or software code executed on one or more processors, sets the voltage level of the threshold control signal 29 by applying a set threshold signal 38 to the threshold control circuit 38. In order to define $V_{low}$, the control circuit 36 sets the set threshold signal 38 to a low value, for example, two times lower than the expected $V_{low}$, of the signal. This value is so low that the output of the decision circuit 126 is always a logic one:

Once this step is accomplished, the control circuit 36 incrementally increases the voltage applied by the threshold control circuit 28 until the output of the decision circuit 126 is no longer all ones. This threshold voltage is deemed the $V_{low}$. The amplitude of the applied voltage before the decision circuit 25, $V_{out}$, is then calculated as $V_{hi}$ minus $V_{low}$ and can be plotted by the control circuit 36 at the frequency of the input signal 23 as a ratio of the $V_{out}/V_{in}$. This entire process is then repeated for all sine wave frequencies of interest. For example, for a 12.5 Gbit/sec input for a high-performance bit error rate tester decision circuit, the frequencies of interest might range from 1 MHz to 26 GHz.

In order to determine when the decision circuit output 126 no longer generates all ones or all zeros, a one-bit comparator (in the form of an exclusive-OR gate) 32 is used. The first input of the exclusive-OR gate 32 is coupled to the output 126 of the decision circuit 25. The second input of the exclusive-OR gate 32 is coupled to the output 31 of a compare level control circuit 30. The output of the exclusive-OR gate 33 will be a logic 1 when the two input signals disagree. This means that a compare level control circuit 30 can set which logic level would produce an enable signal 33 to the awaiting counter 34 downstream. When the output of the compare level control circuit 31 is a one, then any logic zero output from the decision circuit 25 would be counted. Alternatively, when the output of the compare level control circuit 31 is a zero, any logic one output of the decision circuit 25 would be counted. In this way, the control circuit 30 can monitor the count value in the counter 35 to know when the appropriate threshold value is reached.

In an alternate embodiment, the control circuit 30 may directly control the sample clock frequency. After stepping through all the sine wave frequencies of interest and measuring the $V_{lo}$ and $V_{hi}$ signals, the control circuit 30 can display a graph (illustrated below control circuit 30) or present in tabular format the frequency response of the input to the decision circuit.

Figure 2:
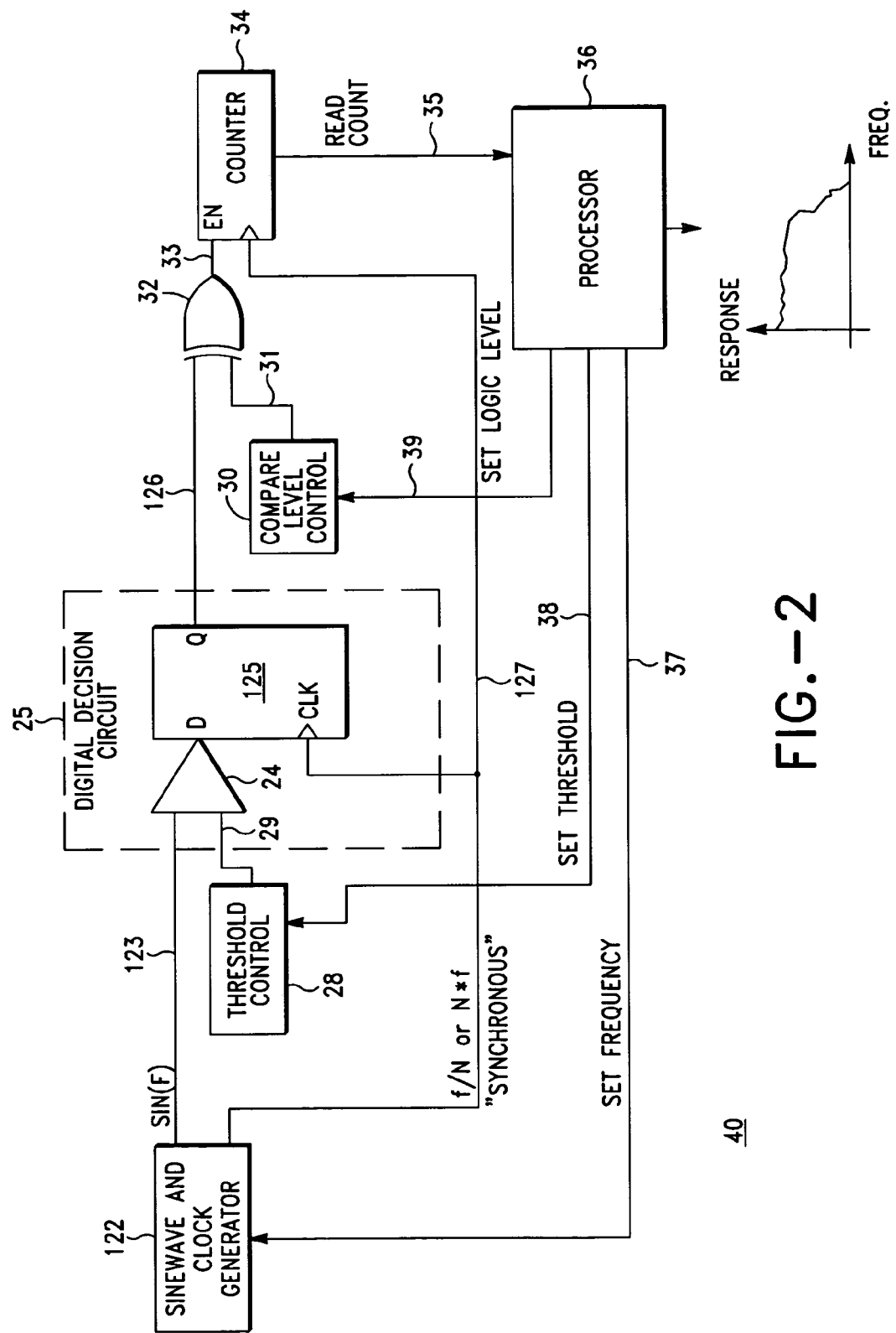
FIG. 2 is a schematic block diagram of an exemplary frequency response circuit configured to operate in a synchronous mode.

FIG. 2 is a schematic block diagram of an alternate embodiment of an exemplary frequency response measurement circuit 40, configured to operate in a synchronous mode. In the synchronous mode, the input signal 123 frequency and the sampling clock signal 127 frequency are the same.

As mentioned above, it is somewhat more involved to perform a synchronous response measurement and it is somewhat more limited. However, the synchronous embodiment is important and is required in certain circumstances. For example, when the sampling clock signal 127 and input data signal 123 frequency are required to be related as in the case of a built-in clock and data recovery unit.

In the synchronous embodiment 40, a sine wave and clock generator circuit 122 is coupled as a first input (to comparator 24) to decision circuit or DUT 25. The synchronous embodiment 40 also includes a threshold control circuit 28, a control circuit 30 and a counter 34, which all perform analogous functions to the earlier described asynchronous embodiment 20 and are connected in a manner consistent with the earlier described asynchronous embodiment 20 except noting the differences defined by synchronous rather than asynchronous clocking.

In the synchronous embodiment 40, the input sine wave signal 123 of a known incident amplitude is generated along with a corresponding synchronous sampling clock signal 127 by the sine wave and clock generator 122 in response to the set frequency control signal 37. The relationship between the sampling clock signal 127 frequency and the input (e.g. sine wave) signal 123 frequency may be an octave (higher) or harmonic (lower) integer value. For example, the input signal 123 may be split with a power splitter and then a divide-by-N circuit used to create a lower-frequency sampling clock signal 127 that would be applied to the clock (CLK) or trigger input of the memory component 125 of the decision circuit 25 that is responsible for sampling the output signal of the comparator 24, which corresponds to the result of the comparison of the input signal 123 and the threshold voltage value 29. In an alternative embodiment, not shown, two clock generators may provided which support a common locking reference frequency, for example, 10 Mhz.

Measuring the $V_{lo}$ and $V_{hi}$ in the synchronous measurement embodiment 40 also requires that the phase of the sampling clock signal 127 as compared to the input signal 123 be adjusted. This is because all samples of the decision circuit 25 as compared to the threshold control signal 29 will be at one repeating phase of the input signal 123 and one must sweep through all possible phases of the input signal 123 in order to find the highest and lowest points where the output of the decision circuit 126 changes from all ones to all zeros, in order to determine the amplitude of the input signal 123 to the decision circuit 25. This extra sweeping process, not required in asynchronous measurements is due to the fact that the asynchronous measurements will naturally make samples at all phases of the input signal 123, is an extra complication for the synchronous application. This means that the control circuit 30 must sweep the threshold control voltage 29 from a high level where the decision circuit output 126 is all zeros to incrementally lower values until the decision circuit output 126 is no longer all zeros. Then, the control circuit 30 must remember these thresholds for all increments of phase of the input sine wave signal 123 and, when measurements are complete for all phases of the input sine wave signal, search the memory to find the highest and lowest thresholds. These two thresholds are subtracted to find the $V_{out}$ in the synchronous case.

After performing the aforementioned operations, the control circuit 30 can then present in either a graphical or tabular presentation the ratio of $V_{out}/V_{in}$ versus all the input signal 123 frequencies to show the frequency response of the input to the decision circuit 25.

Figure 3:
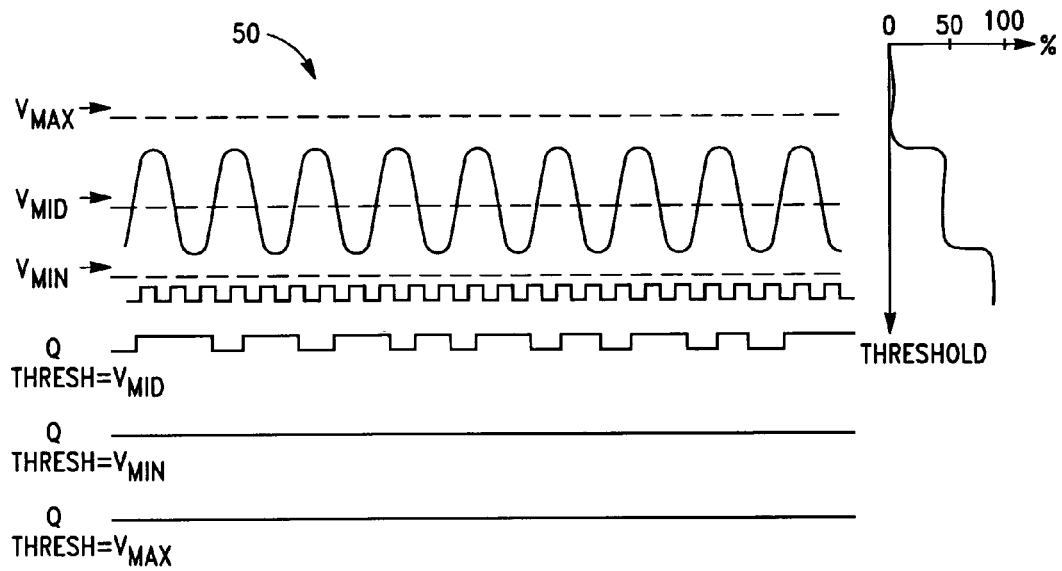
FIG. 3 is a timing diagram illustrating the output of the circuit of the present invention operating in asynchronous mode.

FIG. 3 is a timing diagram 50 illustrating the output of the decision circuit of the present invention operating in asynchronous mode. In this timing diagram 50, the Q-outputs are represented from the decision circuit for various hi, low and middle voltage thresholds. As shown, when the applied threshold voltage is set to $V_{min}$, the Q-output of the decision circuit is all ones. Thus all parts of the input signal are above the threshold. When the applied threshold voltage is set to $V_{max}$, the output of the decision circuit is all zeroes. FIG. 3 also shows that all samples of the input signal are below the threshold control voltage at $V_{max}$.

When the threshold control voltage is set to $V_{mid}$, an alternating sequence of ones and zeros is provided by the decision circuit. As shown in the side graph which corresponds to the average duty cycle measurement versus the threshold control voltage, depending on exactly where the $V_{mid}$ threshold is compared to the edges of the input sine wave, the average duty cycle of the decision circuit output ranges from 0% to 100%. For example, when in the middle of a sine wave, the average duty cycle would be nominally 50%.

Figure 4:
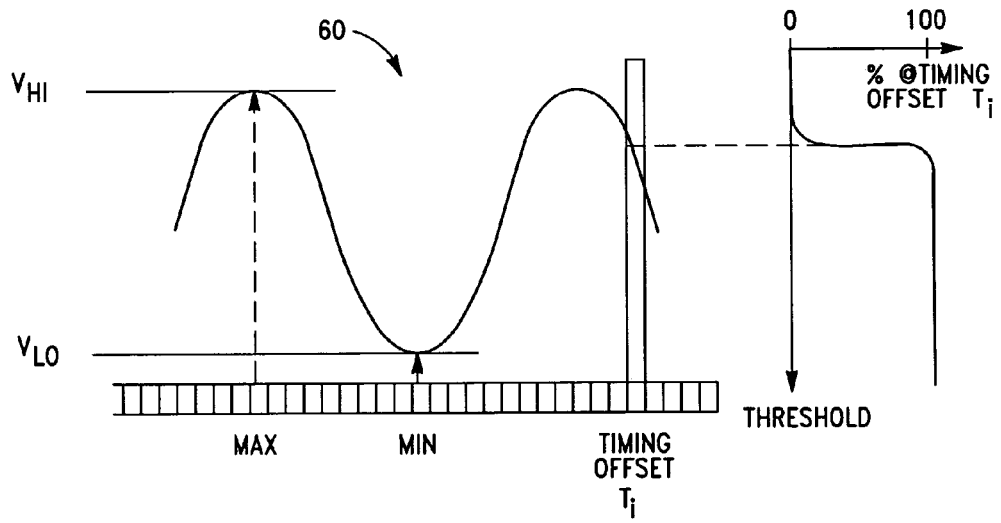
FIG. 4 is a timing diagram illustrating the output of the circuit of the present invention operating in synchronous mode.
Figure 5:
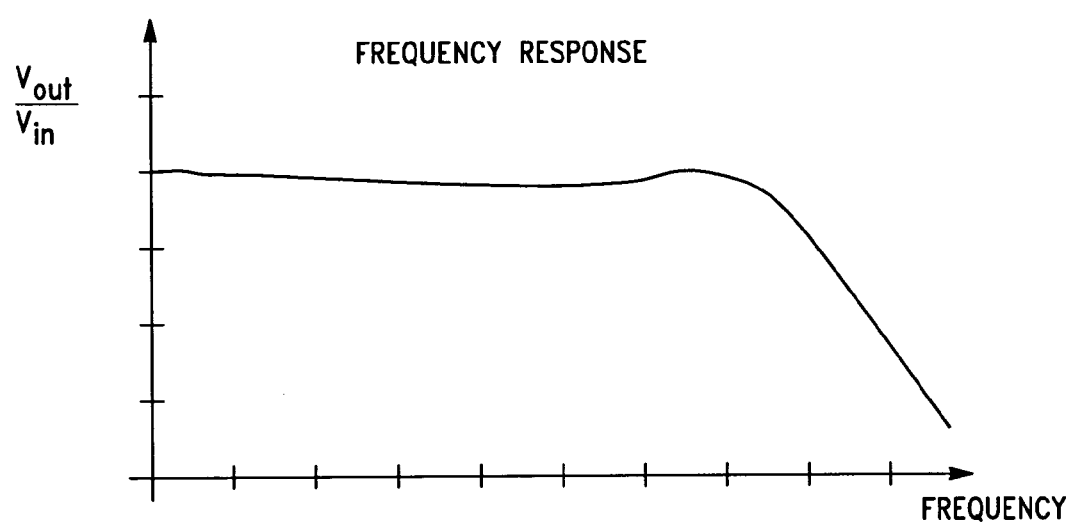
FIG. 5 is a graphical presentation the ratio of $V_{out}/V_{in}$ versus all the input signal frequencies to show the frequency response of the input to the decision circuit.

FIG. 4 is a timing diagram 60 illustrating the output of the decision circuit of the present invention when operating in a synchronous mode. As shown, the synchronous embodiment of the present invention defines and identifies the $V_{lo}$ and $V_{hi}$ of the input signal. As noted above, many measurements must be done at each time offset, $T_i$, to find the highest and lowest voltage present in the input signal. At each time offset within the cycle of the input signal, the threshold control voltage signal is swept from $V_{max}$, where the decision circuit will output all zeros, incrementally lower until the decision circuit output is no longer all zeros. The control circuit then recalls this voltage threshold level. Once measurements have been made for all time-offset increments that define one cycle of the applied input signal, the control circuit can search the measured results to find the lowest and highest measured values, $V_{lo}$ and $V_{hi}$.

At any given time increment, and depending on where the threshold control voltage is set with respect to the input signal, the duty cycle of the decision circuit output will vary from 0% to 100%. In this case, which is different from the asynchronous case, the duty cycle variation will go completely from 0% to 100% in the short amount of voltage thresholds that represent the noise on the single trace of the sine wave input as illustrated using the side graph on FIG. 4. A noisy input signal will have a gentler slope going from 0% to 100% duty cycle where as a clean (or non-noisy) input signal will present a very steep slope going from 0% to 100% duty cycle.

The control circuit 30 is required to control, measure, compute and display the results of the frequency response measurement of the present invention. Exemplary psuedo-code for an algorithm that can be used to implement the necessary asynchronous measurement functions is provided below:

```
Array: FreqResponse[]
Vin = 1Vpp
For(freq= Fmin; freq<Fmax; freq += Fstep)
    {Set frequency of Sine Generator to freq
    Set amplitude of Sine Generator to Vin
    RESET count
    Set Compare Level = 1
    For (thresh = Vmax; count == 0; thresh -= Vstep)
        {}
    Vhi = thresh
    thresh = Vmin
    RESET count
    Set Compare Level = 0
    For (thresh = Vmin; count == 0; thesh += Vstep)
        {}
    Vlo = thresh
    FreqResponse[l] = (Vhi – Vlo) / 1Vin
    }
```

Once this algorithm is completed, the array "FreqResponse" will hold all the frequency responses that correspond to the frequencies of interest between Fmin and Fmax at a resolution defined by Fstep.

A similar algorithm exists for the synchronous embodiment 40 of the present invention. This alternative approach must include a further step whereby it searches through all phase offsets of the input sine wave signal to find the highest and lowest signals. For example, an algorithm which implements the synchronous frequency response measurement functionality of the present invention is provided below:

```
Array: FreqResponse[]
Vin = 1Vpp
Vhi = Vmin
Vlo = Vmax
For(freq= Fmin; freq<Fmax; freq += Fstep)
    {
    Set frequency of Sine Generator to freq
    Set amplitude of Sine Generator to Vin
    For(phase=0;phase<2*pi; phase+= PhaseStep)
        {
        RESET count
        Set Compare Level = 1
        For (thresh = Vmax; count == 0; thresh -= Vstep)
            {}
        if(thresh > Vhi) Vhi = thresh ;
        if(thresh < Vlo) Vlo = thresh ;
        }
    FreqResponse[l] = (Vhi – Vlo) / 1Vin
    }
```

Once this algorithm is completed, the array "FreqResponse" will again hold all the frequency responses that correspond to the frequencies of interest between Fmin and Fmax at a resolution defined by Fstep.

In summary, the present invention discloses exemplary methods and apparatus for measuring the analog input frequency response of a decision circuit by moving the digital decision point while measuring differences in the resulting decisions to measure the amplitude of an applied input signal. Moving the decision point can involve just moving it in voltage (up and down) if asynchronous sampling is used or may involve moving it in voltage and in time if synchronous sampling is used. Synchronous or asynchronous measuring allows for sweeping the input sine wave stimulus to cover all frequencies of interest while plotting the measured amplitude as compared to the applied amplitude to result in the frequency response.

While the foregoing detailed description has described several embodiments of the method and apparatus in accordance with this invention, it is to be understood that the above description is illustrative only and not limiting of the disclosed invention. It will be appreciated that the embodiments discussed above and the virtually infinite embodiments that are not mentioned could easily be within the scope and spirit of this invention. Thus, the invention is to be limited only by the claims as set forth below.

What is claimed is:

1. A method of measuring a frequency response at a decision point of a digital receiver comprising the steps of:

applying an input signal having an amplitude and a frequency to an input of the digital receiver;

determining an amplitude of the input signal at the decision point by sampling the input signal at the decision point using a binary decision circuit while moving a decision threshold voltage of the binary decision circuit and measuring differences in the resulting decisions, an upper value of the amplitude of the input signal at the decision point being based on a minimum value of the decision threshold voltage for which every sample results in a decision that indicates that the input signal at the decision point is less than the decision threshold voltage, and a lower value of the amplitude of the input signal at the decision point being based on a maximum value of the decision threshold voltage for which every sample results in a decision that indicates that the input signal at the decision point is greater than the decision threshold voltage; and calculating the frequency response at the decision point as the ratio of the amplitude of the input signal at the decision point to the amplitude of the input signal at the input of the digital receiver.

2. The method of claim 1 further comprising the steps of:

changing the frequency of the input signal to a different frequency; and repeating the applying, determining, and calculating steps.

3. The method of claim 1 wherein the binary decision circuit samples the input signal at a frequency that is synchronous to the frequency of the input signal.

4. The method of claim 1 wherein the binary decision circuit samples the input signal at a frequency that is asynchronous to the frequency of the input signal.

5. An apparatus for measuring a frequency response at a decision point of a digital receiver comprising:

circuitry operative to apply an input signal having an amplitude and a frequency to an input of the digital receiver;

circuitry operative to determine an amplitude of the input signal at the decision point by sampling the input signal at the decision point using a binary decision circuit while moving a decision threshold voltage of the binary decision circuit and measuring differences in the resulting decisions, an upper value of the amplitude of the input signal at the decision point being based on a minimum value of the decision threshold voltage for which every sample results in a decision that indicates that the input signal at the decision point is less than the decision threshold voltage, and a lower value of the amplitude of the input signal at the decision point being based on a maximum value of the decision threshold voltage for which every sample results in a decision that indicates that the input signal at the decision point is greater than the decision threshold voltage; and circuitry operative to calculate the frequency response at the decision point as the ratio of the amplitude of the input signal at the decision point to the amplitude of the input signal at the input of the digital receiver.

6. The apparatus of claim 5 further comprising:

circuitry operative to change the frequency of the input signal to a different frequency; and circuitry operative to repeat the applying, determining, and calculating steps.

7. The apparatus of claim 5 wherein the binary decision circuit samples the input signal at a frequency that is synchronous to the frequency of the input signal.

8. The apparatus of claim 5 wherein the binary decision circuit samples the input signal at a frequency that is asynchronous to the frequency of the input signal.

\* \* \* \* \*